United States Patent
Zhu

(10) Patent No.: US 9,948,261 B2
(45) Date of Patent: Apr. 17, 2018

(54) METHOD AND APPARATUS TO EQUALIZE ACOUSTIC RESPONSE OF A SPEAKER SYSTEM USING MULTI-RATE FIR AND ALL-PASS IIR FILTERS

(71) Applicant: Tymphany HK Limited, Wanchai (HK)

(72) Inventor: Qiang Zhu, Churchville, PA (US)

(73) Assignee: TYMPHANY HK LIMITED, Wan Chai (HK)

( * ) Notice: Subject to any disclaimer, the term of this patent is extended or adjusted under 35 U.S.C. 154(b) by 2 days.

(21) Appl. No.: 14/946,896

(22) Filed: Nov. 20, 2015

(65) Prior Publication Data
US 2016/0149550 A1 May 26, 2016

Related U.S. Application Data

(60) Provisional application No. 62/082,568, filed on Nov. 20, 2014.

(51) Int. Cl.
H03G 5/16 (2006.01)
H03G 5/00 (2006.01)
H04R 3/04 (2006.01)

(52) U.S. Cl.
CPC ............ *H03G 5/165* (2013.01); *H03G 5/005* (2013.01); *H04R 3/04* (2013.01); *H04R 2420/07* (2013.01); *H04R 2430/03* (2013.01)

(58) Field of Classification Search
CPC .......... H03G 5/165; H03G 5/005; H04R 3/04; H04R 2420/07; H04R 2430/03
See application file for complete search history.

(56) References Cited

U.S. PATENT DOCUMENTS 5,675,658 A 10/1997 Brittain
5,757,931 A 5/1998 Yamada et al.
(Continued)

FOREIGN PATENT DOCUMENTS

WO 2009047673 A2 4/2009
WO 2014002452 A1 1/2014

OTHER PUBLICATIONS

International Search Report and Written Opinion; International Application No. PCT/US15/61792; International Filing Date: Nov. 20, 2015; dated May 11, 2016; 14 pages.

*Primary Examiner* — Ping Lee
(74) *Attorney, Agent, or Firm* — Cantor Colburn LLP

(57) ABSTRACT

A speaker system includes an electronic signal processing unit configured to split an input audio signal into a low-pass audio component and a high-pass audio component. The electrical signal processing unit includes a multi-rate finite impulse response (FIR) filter configured to downsample the low-pass audio component and sample the downsampled low-pass audio component at a first sampling rate lower than a second sampling rate used to sample the high-pass audio component. The speaker system further includes an electronic adaptive equalizer coefficient (EAEC) module configured to dynamically determine at least one equalizer coefficient based on a signal characteristic of the input audio signal. An electronic filter coefficient update unit (FCUU) is included and is configured to control a frequency response of the speaker system based on the at least one equalizer coefficient.

16 Claims, 20 Drawing Sheets

(56) References Cited

U.S. PATENT DOCUMENTS

| | | | |
|---|---|---|---|
| 6,760,451 B1* | 7/2004 | Craven | H03G 5/005 |
| | | | 381/59 |
| 2005/0135631 A1 | 6/2005 | Yoshino | |
| 2008/0279318 A1* | 11/2008 | Bharitkar | H04R 3/04 |
| | | | 375/350 |
| 2011/0099021 A1 | 4/2011 | Zong et al. | |
| 2012/0185524 A1 | 7/2012 | Clark | |
| 2013/0208895 A1 | 8/2013 | Hobach et al. | |
| 2015/0201294 A1* | 7/2015 | Risberg | H04R 3/002 |
| | | | 381/59 |

* cited by examiner

Peaking

Lowpass

Cascading to form a bank of Biquads

METHOD AND APPARATUS TO EQUALIZE ACOUSTIC RESPONSE OF A SPEAKER SYSTEM USING MULTI-RATE FIR AND ALL-PASS IIR FILTERS

DOMESTIC PRIORITY

This is a non-provisional application of U.S. Provisional Patent Application Ser. No. 62/082,568, filed Nov. 20, 2014, the disclosure of which is incorporated by reference herein in its entirety.

FIELD OF INVENTION

The present invention relates generally to audio signal processing, and more specifically, to equalizing an acoustic response of a speaker system.

BACKGROUND

Technological advances in signal processing have been applied in the design and construction of modern audio systems to deliver undistorted audio signals intended to a listener. Musicians and audio producers, for example, desire that their listeners realize a natural and high-quality acoustic audio signal with the least amount of distortion possible. However, various electrical and hardware components of conventional speaker systems intended to deliver the acoustic sound signal to the listener can also introduce undesirable noise (i.e., distortion) into the sound signal.

For example, it is typically necessary to take into account one or more components of the underlying sub-system such as the amplifier and the driver response limit since these components can bottleneck acoustic performance even with a perfect equalization settings. In addition, a typical consumer grade driver has limited excursion. As a result, typical consumer grade drivers are susceptible to saturation (i.e., operating in a power compression mode in which the input power will be mostly converted to heat) when the (equalized) power level delivered to the driver exceeds the driver's operating limit Driver saturation can cause the driver's impedance to rise, which in turn generates distorted audio and reduces the quality of the sound output. Consequently, the listener realizes a lower-quality audio signal that lacks natural sounding acoustics.

SUMMARY

According to at least one non-limiting embodiment of the present invention, a speaker system comprises an electronic signal processing unit configured to split an input audio signal into a low-pass audio component and a high-pass audio component. The electrical signal processing unit includes a multi-rate finite impulse response (FIR) filter configured to downsample the low-pass audio component and sample the downsampled low-pass audio component at a first sampling rate lower than a second sampling rate used to sample the high-pass audio component.

According to another non-limiting embodiment of the invention, a method of equalizing an acoustic audio signal processed by a speaker system includes splitting an input audio signal into a low-pass audio component and a high-pass audio component. The method further includes downsampling the low-pass audio component. The method further includes sampling the downsampled low-pass audio component at a first sampling rate lower than a second sampling rate used to sample the high-pass audio component.

According to yet another non-limiting embodiment of the invention, an adaptive audio equalization system comprises at least one audio speaker configured to generate an acoustic audio signal. An electronic signal processing unit is configured to receive a feedback signal output from a listening device disposed in an environment remotely located from the audio speaker. The signal processing unit dynamically equalizes the acoustic audio signal delivered to the listening device based on one or more acoustic conditions existing in the environment during real-time.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

Figure 1:
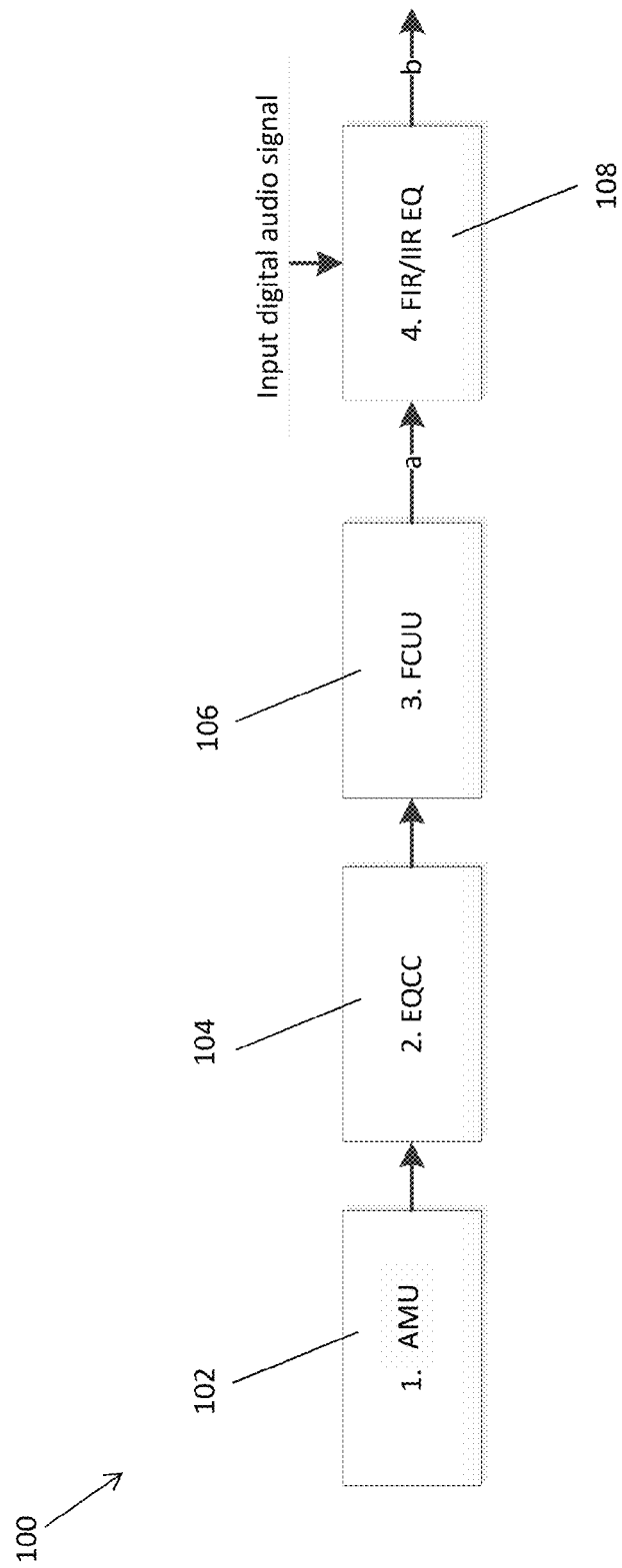
FIG. 1 illustrates a speaker system including an electronic multi-rate finite impulse response (FIR) filter and all-pass infinite impulse response (IIR) filter equalizer (FIR/IIR EQ) module configured to equalize an acoustic response of a input audio signal.

Referring now to FIG. 1, a speaker system 100 is illustrated according to a non-limiting embodiment. The speaker system includes a real-time or off-line electronic acoustic measurement unit AMU 102, an electronic equalizer coefficient calculator (EQCC) 104, a filter coefficient update unit (FCUU) 106, and an electronic multi-rate finite impulse response (FIR) filter and all-pass infinite impulse response (IIR) FIR/IIR equalizer (FIR/IIR EQ) module 108. The AMU 102 utilizes sound pressure level (SPL), for example, to predict an expected acoustic frequency response. That is, the AMU 102 predicts what the listener is expected to hear in an unequalized speaker system. The measurement typically consists of acoustic amplitude and phase responses. The measured output signal is then sent to the EQCC 104.

Figure 2:
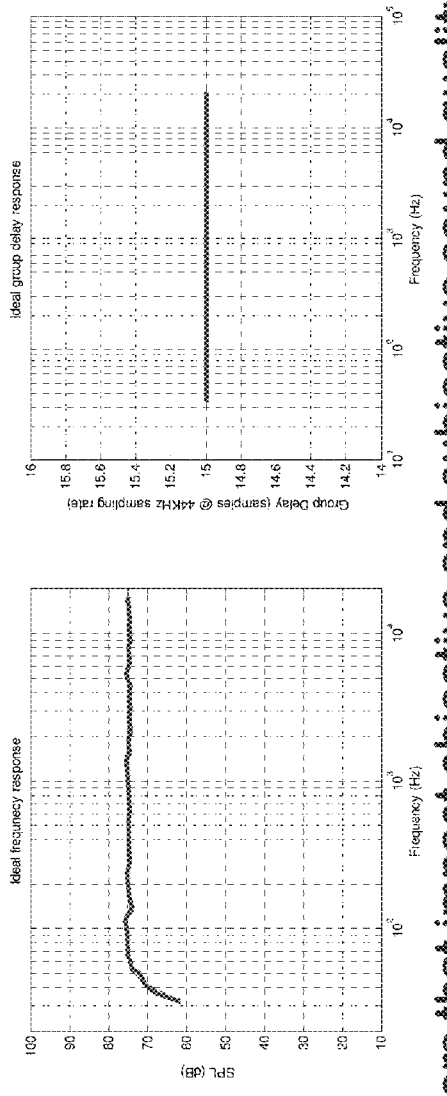
FIG. 2 are line graphs illustrating examples of an ideal frequency response and an ideal group delay response.

The EQCC 104 is configured to determine an ideal acoustic frequency response and to minimize the difference between the measured response and an ideal response (i.e., response differential). The ideal response may be determined using various algorithms and/or acoustic models stored in the EQCC 104. According to an embodiment, the response differential is minimized using, for example, a Zero-Forcing (ZF) algorithm or general Mean-Square-Error (MSE) algorithm. The ideal response could be a flat amplitude response across the entire audible band (e.g., between 20 Hz and 20 KHz) or any desirable shape per application (see FIG. 2). The ideal response could also include flat group delays across bands of interest for non-minimum phase speaker system where precise reproduction of audio image is desirable. The EQCC 104 calculates the equalizer coefficients based on the response differential and outputs a response coefficient signal (e.g., signal a) indicative of the equalizer coefficients to the FCUU 106. The FCUU 106 loads the equalizer coefficients which support the FIR/IIR EQ module 108.

Figure 3:
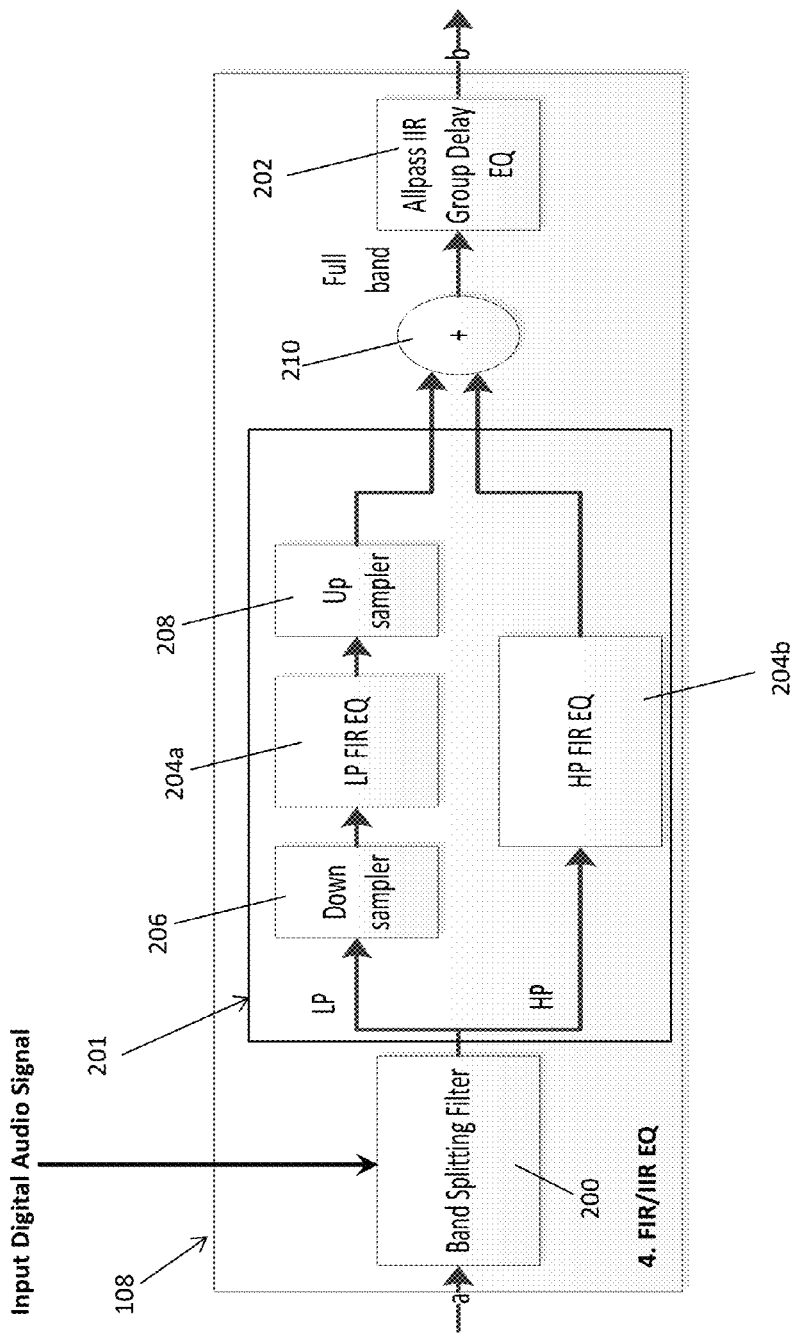
FIG. 3 is a detailed view of an exemplary FIR/IIR EQ module included in the speaker system shown in FIG. 1.

Referring now to FIG. 3, the FIR/IIR EQ module 108 is illustrated in greater detail. The FIR/IIR EQ module 108 includes a band splitting filter 200, a concatenated multi-rate FIR filter 201, and an all-pass IIR filter 202. The band splitting filter 200 splits the response coefficient signal output from the FCUU 106 into a low pass (LP) component and a high-pass (HP) component. The multi-rate FIR filter 201 includes a pair of FIR equalizers (e.g., a low-pass FIR equalizer 204a and a high-pass FIR equalizer 204b) configured to perform amplitude corrections on the high-pass signal and the low-pass signal, respectively. In at least one embodiment, the low-pass FIR equalizer 204a has a longer length than the high-pass FIR equalizer 204b due to the larger wavelength associated with the low-pass FIR equalizer 204a.

Figure 4A:
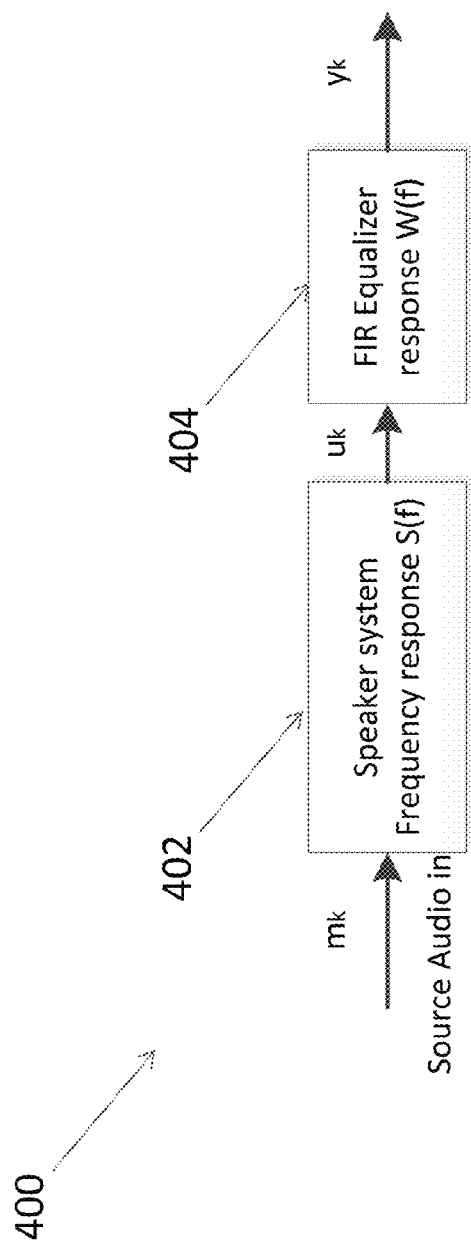
FIG. 4A illustrates an example of a speaker system including a FIR equalizer according to a non-limiting embodiment.

Referring to FIG. 4A, a block diagram illustrated an audio system 400 is illustrated. One or more audio speakers (not shown) may be installed in the audio system 400 so as to define a speaker network. The audio system 400 includes a speaker system frequency response unit 402 in signal communication with a FIR equalizer unit 404. The speaker system frequency response unit 402 receives an input audio source ($m_k$) and dynamically calculates a varying frequency response S(f) of the audio system 400 (e.g., the speaker network). Based on S(f), the speaker system frequency response unit 402 outputs a distorted audio sample ($u_k$) of the underlying audio system 400, which is received by the FIR equalizer unit 404.

The FIR equalizer unit 404 determines an equalizer response value W(f), which may then be used to calculate final equalized audio sample ($y_k$). In at least one embodiment, the final equalized audio sample ($y_k$) may be calculated according to the following equation:

$$y_k = \Sigma_{i=1}^{L} u_{k-1+1} W_i, \text{ where:}$$

"L" is the FIR length;
"i" is the sampling interval;
$u_k$ is the distorted audio sample of the underlying audio system 400; and
$W_i$ is a weighted value applied to the sampled interval.

Figure 4B:
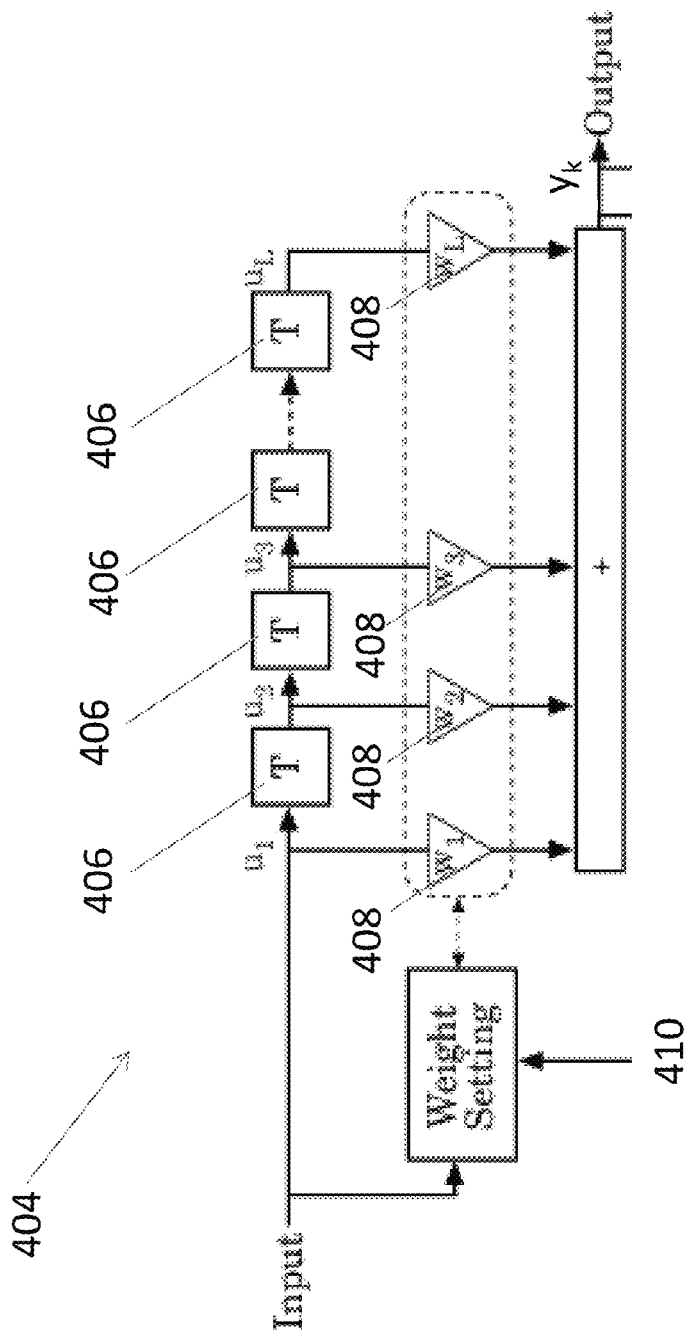
FIG. 4B illustrates an example of a FIR equalizer according to a non-limiting embodiment

According to a non-limiting embodiment, the FIR equalizers 204a-204b may include a plurality of taps 406 (e.g., 1024 taps, 2048 taps, etc.) and weighted settings or values ($W_1$-$W_L$) 408 (see e.g., FIG. 4). The taps 406 output a sampling interval ($u_i$-$u_L$) of the input signal. The weighted settings ($W_L$) 408 may be calculated and applied by a hardware control module 410. For example, a microcontroller included in the control module 410 may calculate one or more weighted settings and output a controls signal which applies the weighted setting to the output line of the taps 406. Although not illustrated, a summing device may be included which sums the weighted settings to the signal appearing on a respective tap 406.

In at least one embodiment, weighted values ($W_L$) are a function of a known desired frequency response Z(f) with respect to the dynamic frequency response S(f) calculated by the speaker system frequency response unit 402. The weighted values ($W_L$) may be determined, for example, using a zero-forcing algorithm. For instance, $W_L$ may be calculated using the following equation:

$$W_L(f) = \frac{Z(f)}{S(f)} \rightarrow \{W_k\} = iFFT(W(f))$$

According to a non-limiting embodiment, Z(f)=1∀f∈[20, 20 KHz]. The calculated weight value (WL) may then be used to determine the final equalized audio sample ($y_k$) as discussed above. In at least one embodiment, the channel to be equalized is assumed to be in minimum phase. This improves threshold on-axis, close-proximity placement of the input sound sensor (i.e., microphone). In addition, the underlying system provided by the FIR equalizers is linear, thereby allowing non-linear distortions to be corrected.

According to a non-limiting embodiment, the multi-rate FIR filter 201 takes into the consideration that the low-frequency audio component can be processed at a much lower sampling frequency. For instance, the low pass branch may include a down sampler unit 206 located upstream from the low-pass FIR equalizer 204a. In this manner, the low-frequency audio component can be processed at a much lower sampling frequency such as, for example, at 10th of the typical 44.1 KHz digital audio sampling rate if the cross-over frequency (typically in lower hundred Hz) is substantially below the twice of the Nyquist rate to reduce the number of FIR taps before being up sampled via up sampler unit 208 and combined with the high-pass signal processed by the high-pass branch using, for example, a summer 210.

Figure 5A:
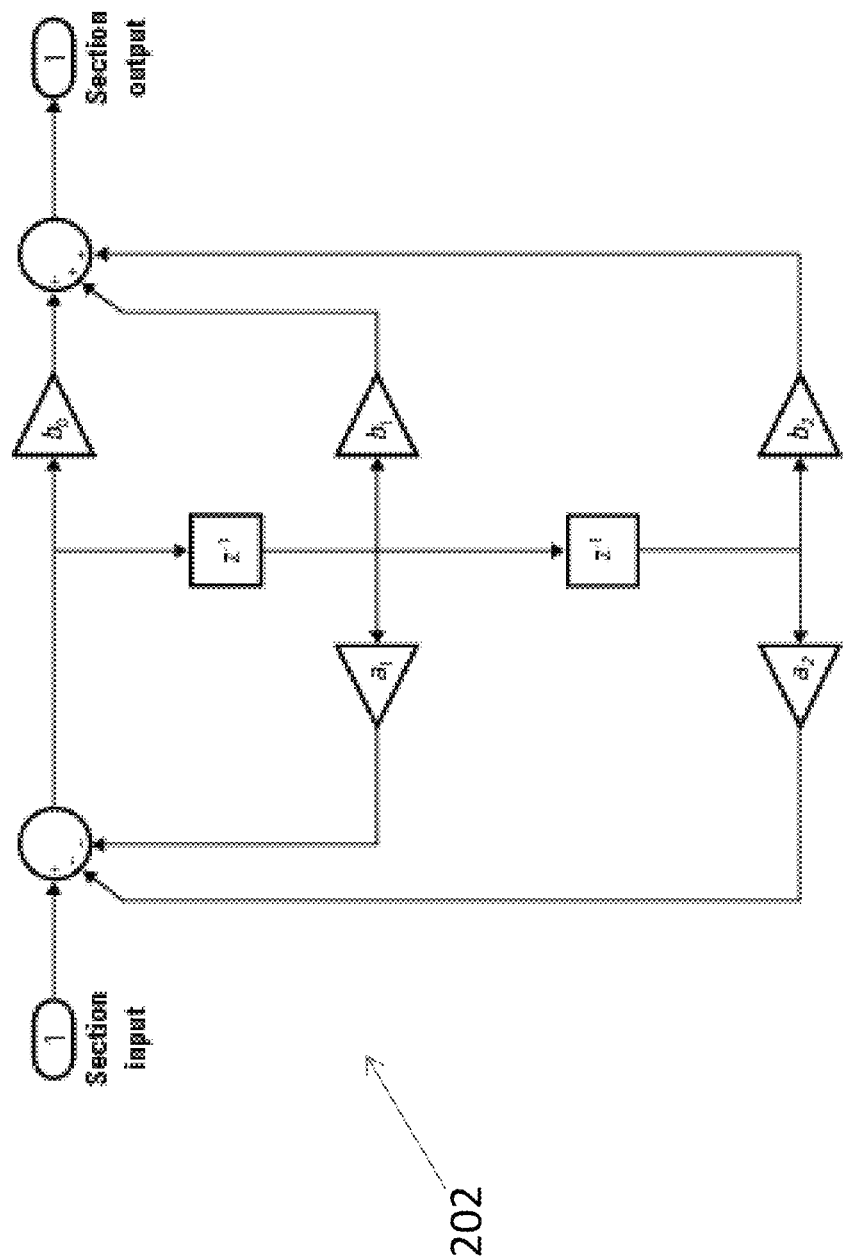
FIG. 5A illustrates an example of a IIR filter according to a non-limiting embodiment.
Figure 5C:
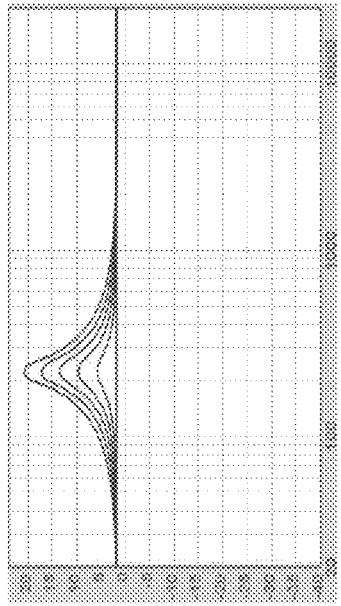
FIGS. 5B-5D are graphs illustrating operation of the IIR filter according to a non-limiting embodiment.
Figure 5B:
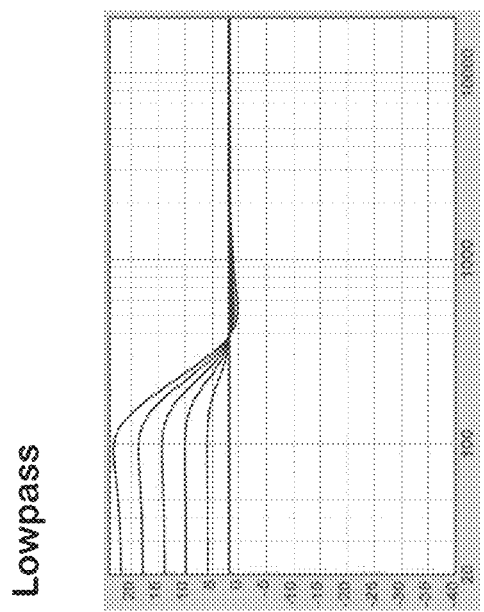
Figure 5D:
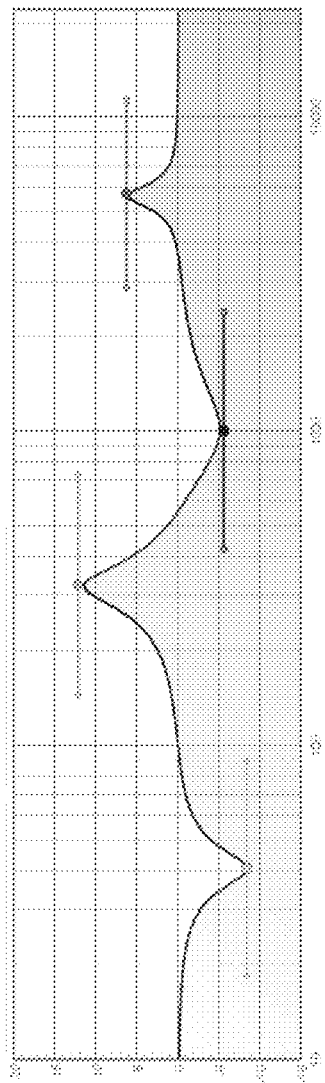

The all-pass IIR filter 202 receives the combined FIR outputs from the low-frequency and high frequency branches via the summer 210 and performs group-delay corrections on the combined output signals using, for example, a group-delay equalizer. When the system is behaving as minimum phase system equalized by a minimum phase FIR filter, group delay distortion can be automatically corrected when the output is flat. The all-pass IIR filter 202 may utilize, for example, a biquad filter 202 (see FIG. 5). The biquad filter 202 allows for cascading the low pass portion of the signal (see FIG. 5B) with the peaking portion of the signal (see FIG. 5C) to generate a bank of biquad outputs (see FIG. 5D). The final output signal (e.g., signal b) of the FIR/IIR EQ block is an equalized audio signal that has a matching or substantially close frequency response with respect to the intended frequency response defined by the user. In at least one embodiment, the section output H(z) generated by the biquad filter 202 is defined as:

$$H(z) = \frac{b_0 + b_1 z^{-1} + b_2 z^{-2}}{1 + a_1 z^{-1} + a_2 z^{-2}}$$

Figure 6:
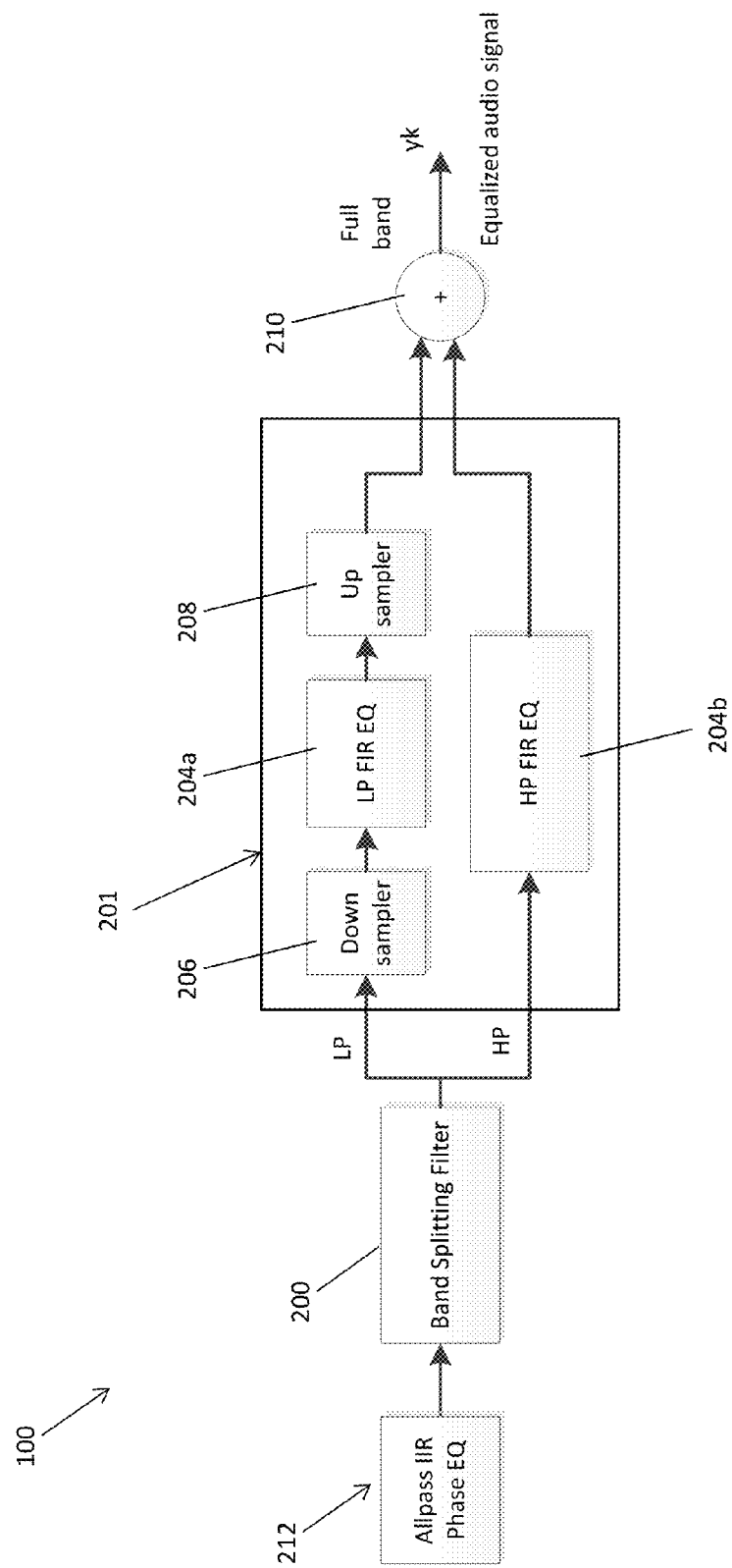
FIG. 6 illustrates an example of an all-pass IIR filter disposed upstream from a FIR/IIR EQ module for operating in a non-minimum phase operation.

According to an embodiment, the speaker system 100 can use an upstream all-pass IIR filter 212 to compensate for phase error or group delay when the speaker system 100 exists in non-minimum phase (see e.g., FIG. 6). The multi-rate FIR filter 201 may then be used to for amplitude correction. In this manner, the FIR based equalization can be easily adapted to different real-life listening environments.

Figure 7:
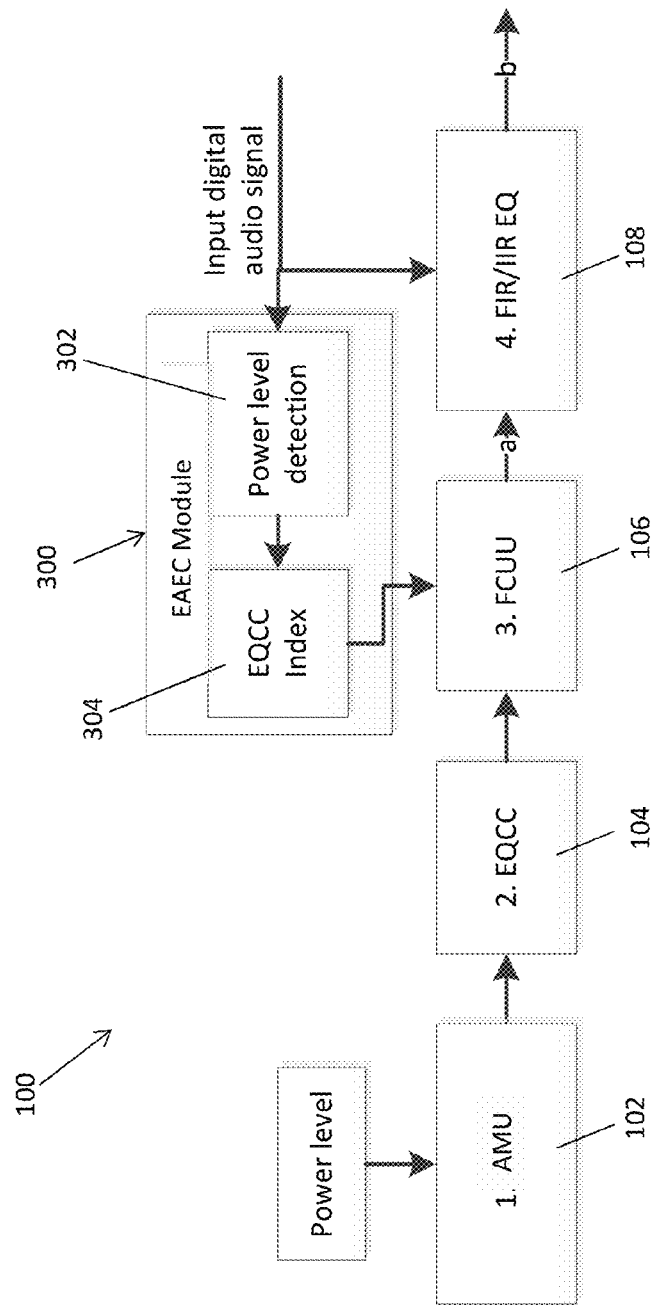
FIG. 7 illustrates a speaker system including an electronic FIR/IIR EQ module and an electronic adaptive equalizer coefficient (EDEC) module configured to dynamically adjust the frequency response of the speaker system based on the input power level according to a non-limiting embodiment of the invention.

Turning now to FIG. 7, a speaker system 100 including an electronic FIR/IIR EQ module 108 and an electronic adaptive equalizer coefficient (EAEC) module 300 is illustrated according to a non-limiting embodiment. The EAEC module 300 is configured to dynamically adjust the frequency response of the speaker system 100 based on signal characteristics (e.g., the power level) of input audio signal. In this manner, the desired frequency response can follow the output limit of various components of the speaker system (e.g., the driver and/or amplifier) as the upper bound at any given power level. Accordingly, the desired frequency response can be dynamically adjusted (i.e., adjusted adaptively) to take into account the practical limitations of the electronic and hardware components of the speaker system.

As further illustrated in FIG. 7, the EAEC module 300 has an input that receives the input audio signal and an output in signal communication with the FCUU 106. The EAEC module 300 further includes an electronic power level measurement unit 302 in signal communication with an electronic EQCC index unit 304. The power level measurement unit 302 includes one or more sensors, for example, configured to measure the power level of the input audio signal. The electronic EQCC index unit 304 is configured to determine one or more equalizer coefficients that define an appropriate frequency response (i.e., a desired frequency response that follows the output limit of various components of the speaker system) based on the measured power level of the input audio signal.

Figure 8D:
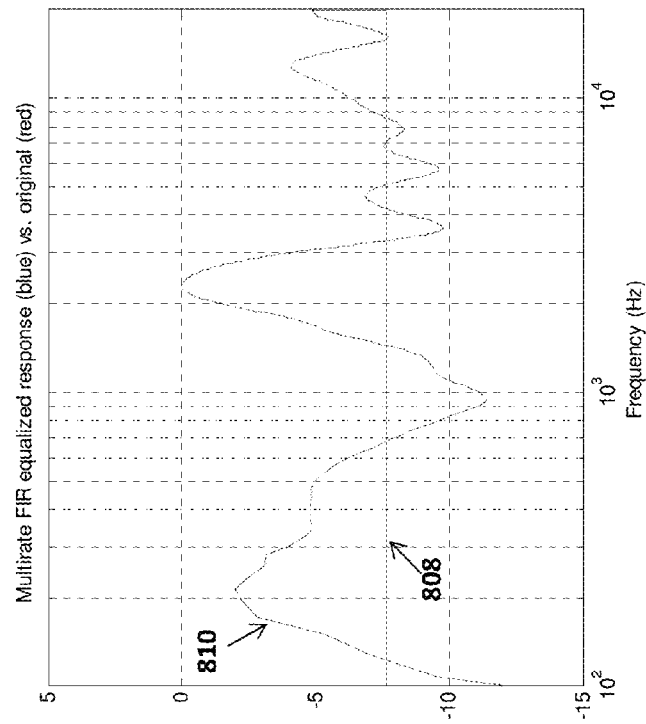
FIGS. 8A-8D show various examples of signal diagrams illustrating the behavior of the multi-rate FIR processing operations.
Figure 8A:
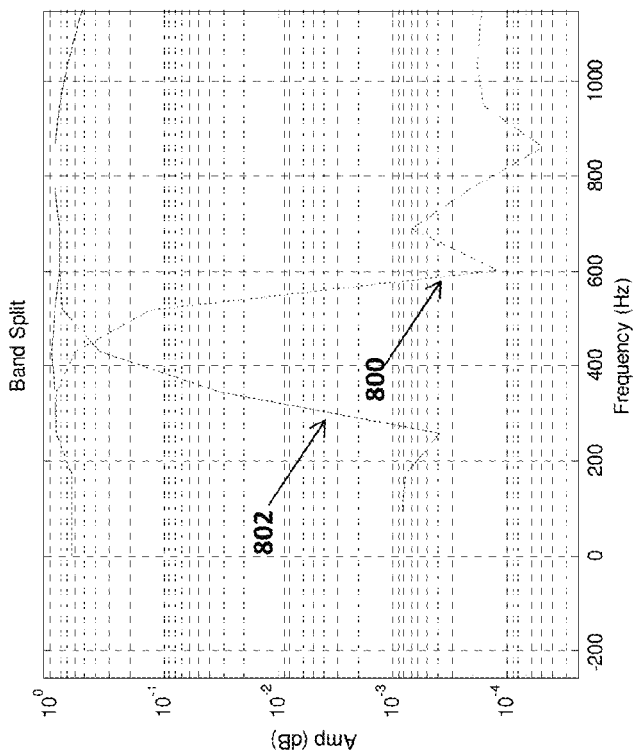
Figure 8C:
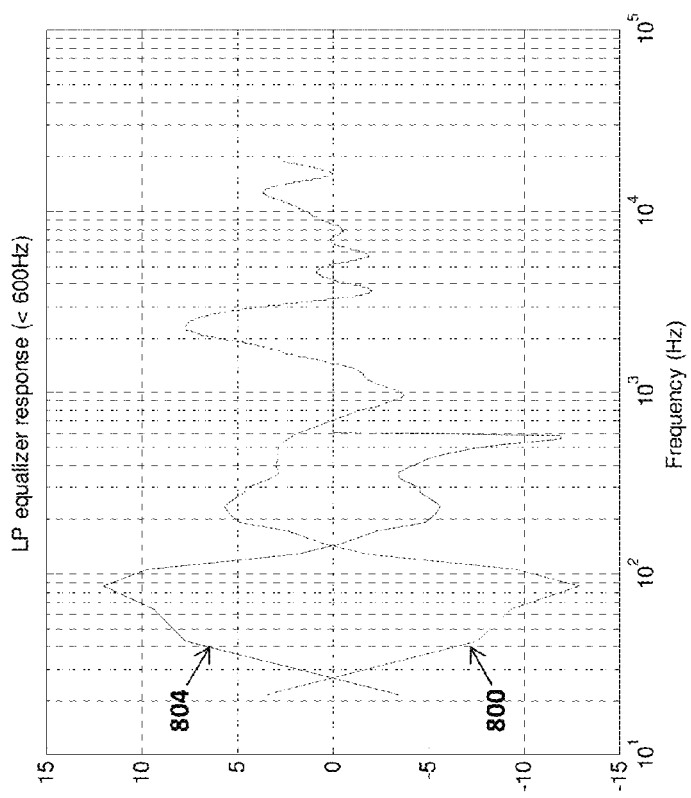
Figure 8B:
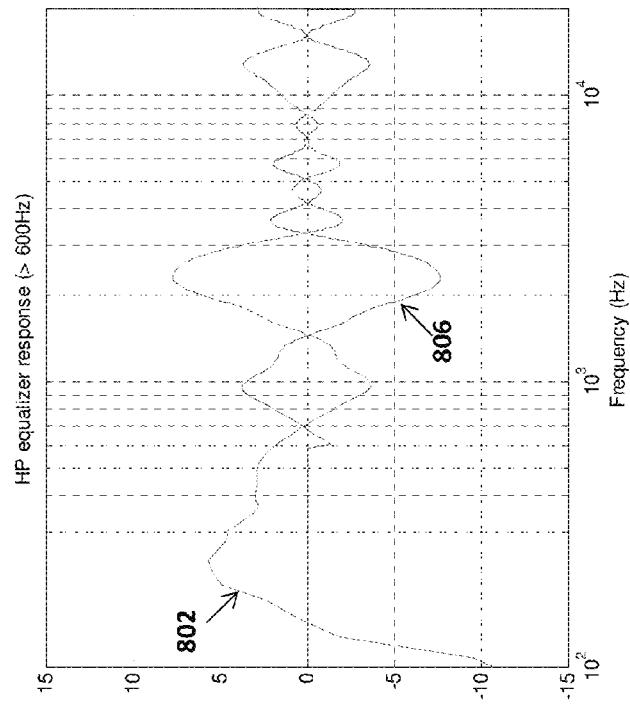

According to an embodiment, the EQCC index unit 304 stores a look-up table (LUT) in memory. The LUT is populated with a plurality of equalizer coefficients that are cross-referenced to a respective power level. The LUT can be generated off-line according to various different power levels and/or dynamically. In this manner, the EQCC index unit 304 compares the measured power level received from the power level measurement unit 302 to the LUT and determines one or more appropriate equalizer coefficients which are then output to the FCUU 106. The FCUU 106 is loaded with the equalizer coefficients selected by the EQCC index unit 304, and in turn defines an appropriate frequency response based on the loaded equalizer coefficients that correspond to the power level of the input audio signal. As the power level of the input audio signal changes, the EAEC module 300 dynamically outputs the appropriate equalizer coefficients to the FCUU 106. Accordingly, the frequency response of the speaker system 100 can be dynamically adjusted to adapt to variations of the input audio signal power level and ensure that the output response is optimized despite system constraints such as, for example, the excursion limit of various components such as the driver, amplifier, etc. In this manner, a high-quality natural acoustic sound signal with minimal distortion can be delivered to the listener while taking into account dynamic changes in the signal characteristics (e.g., power level) of the input audio signal. Therefore, speaker system 100 can easily adapt to different real-time listening environments when a minimum-phase channel becomes unavailable. Various examples of signal diagrams illustrating the behavior of the multi-rate FIR processing operations are shown in FIGS. 8A-8D. For example, FIG. 8A illustrates a first signal 800 (e.g. low-pass signal 800) and a second signal 802 (e.g., high-pass signal 802) output from the band splitting filter 200. A low-pass (LP) equalizer response signal 804 with respect to the split LP signal 800 is illustrated in FIG. 8B, while a high-pass (HP) equalizer response signal 806 with respect to the split HP signal 802 is illustrated in FIG. 8C. Referring to FIG. 8D, the flattened multi-rate FIR equalized response signal 808 is shown with respect to the original input signal 810.

Figure 9:
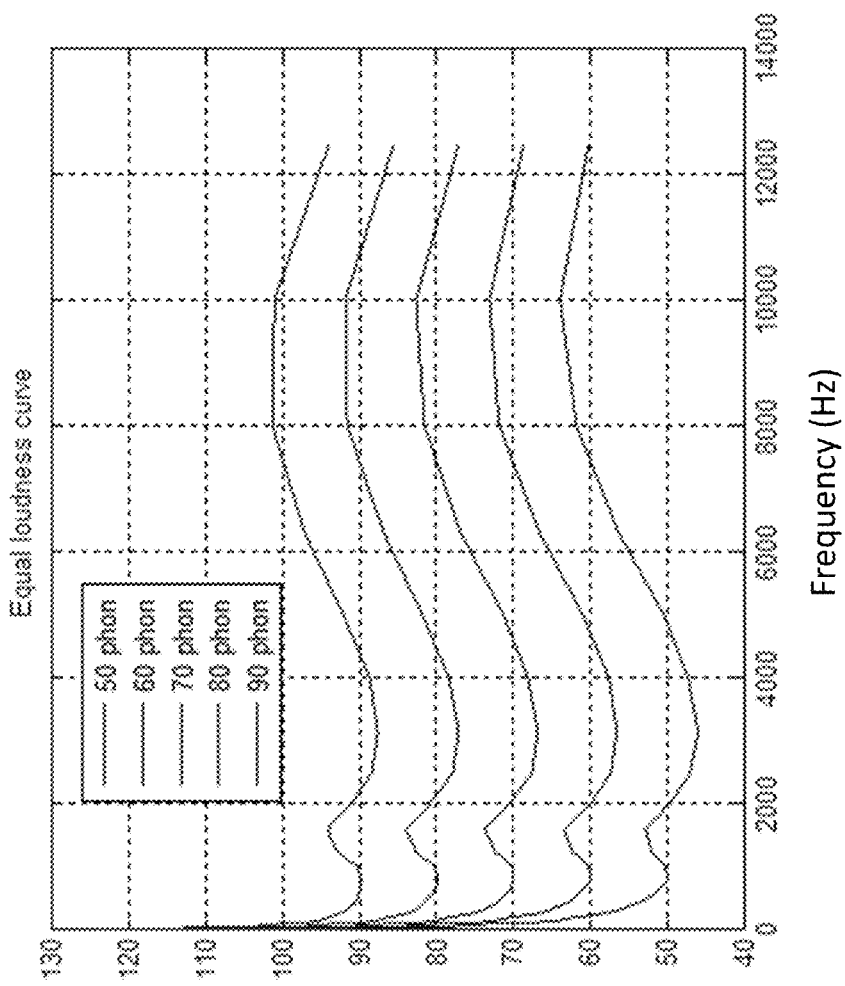
FIG. 9 illustrates equal loud curves corresponding to different power levels, which are stored by an EDEC module according to a non-limiting embodiment.

The EAEC module 300 is further configured to employ pre-calibrated equalization curves. The pre-calibrated equalization curves are pre-calibrated with respect to different power levels and are stored in memory, e.g., random access memory (ROM) included with the electronic EAEC module 300. In this manner, the EAEC module 300 can optimize the system 100 by employing a stored pre-calibrated equalization curve based on the input power level. The EAEC module 300 is also configured to add and/or store equal loudness curves in memory. The equal loudness curves correspond to different power levels such that a greater acoustic reproduction effect can be achieved. FIG. 9, for example, illustrates various equal loudness curves stored by the EAEC module 300.

Figure 10A:
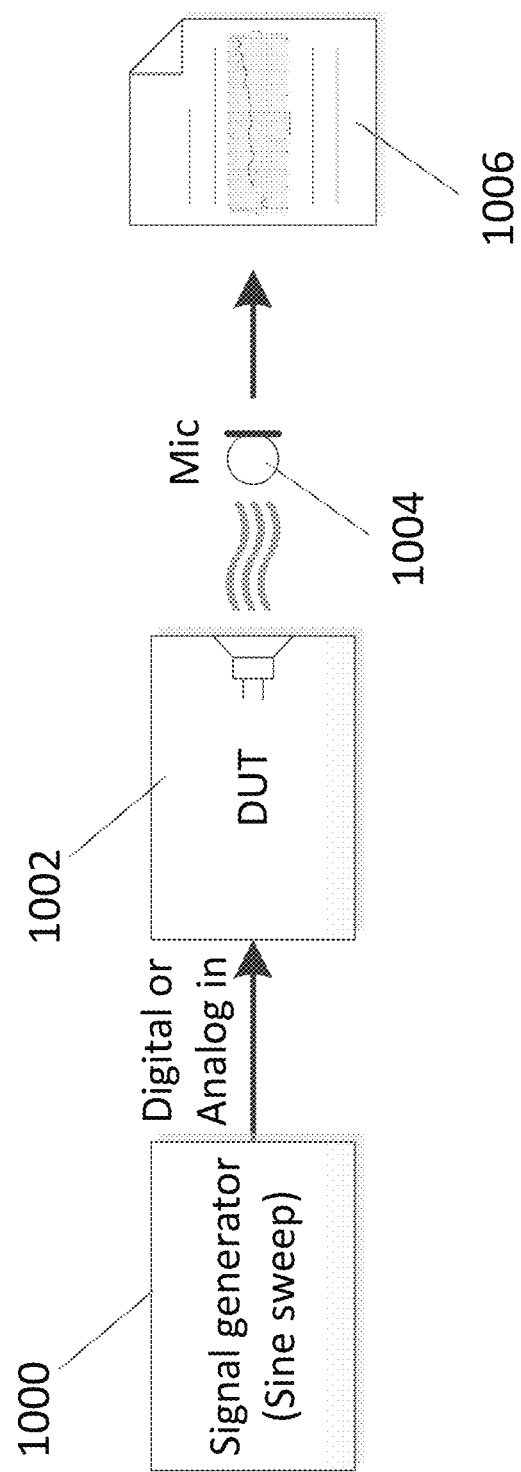
FIGS. 10A-10B illustrate a method of determining an off-line FIR equalizer design.
Figure 10B:
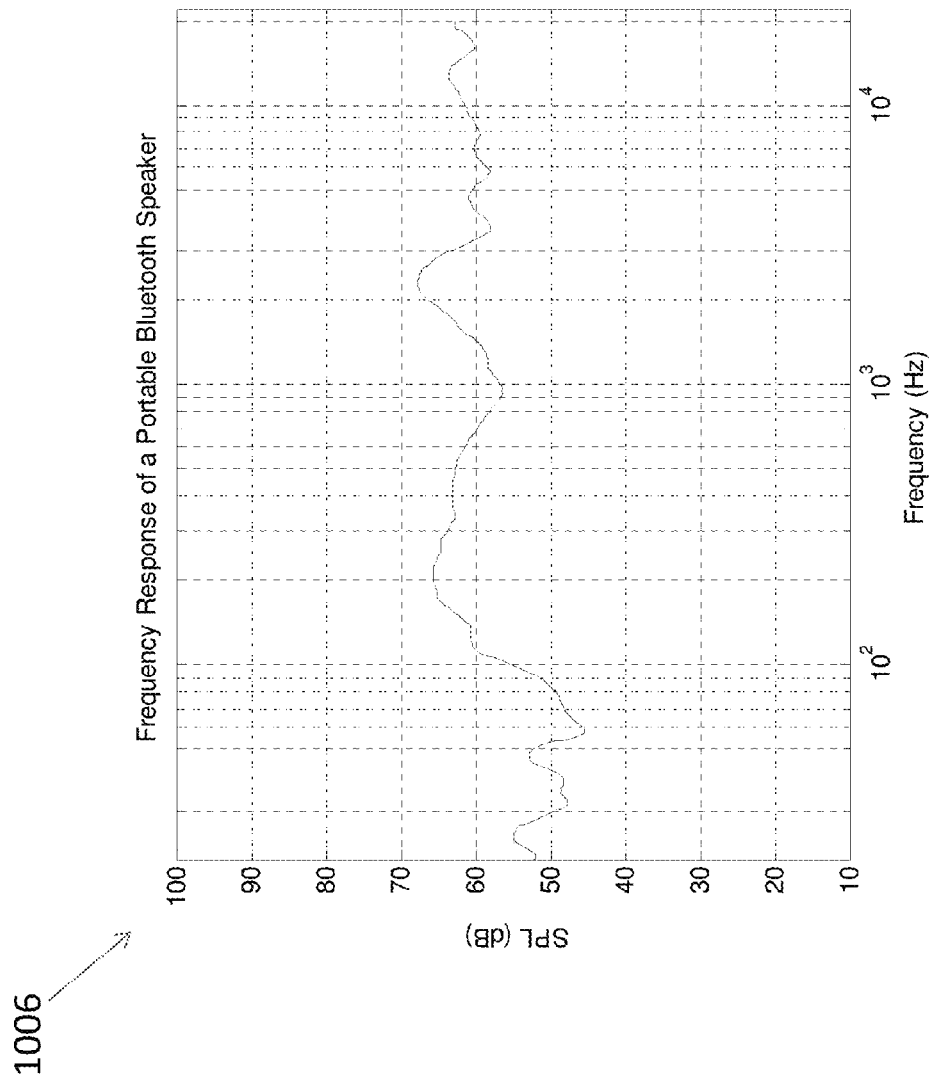

Referring now to FIGS. 10A-10F, a method of determining an off-line FIR equalizer design is illustrated according to a non-limiting embodiment. Referring to FIG. 10A, a sine wave is injected by an electronic signal generator 1000 into a device under test (DUT) 1002 and swept across a selected spectrum range. In at least one embodiment, the spectrum ranges from approximately 20 Hz-20 KHz. The DUT 1002 generates an audio output that is detected by an audio sensor 1004 (e.g., a microphone). The resulting response 1006 at each frequency is then measured and stored. An example of a stored frequency response is illustrated in FIG. 10B.

Figure 10C:
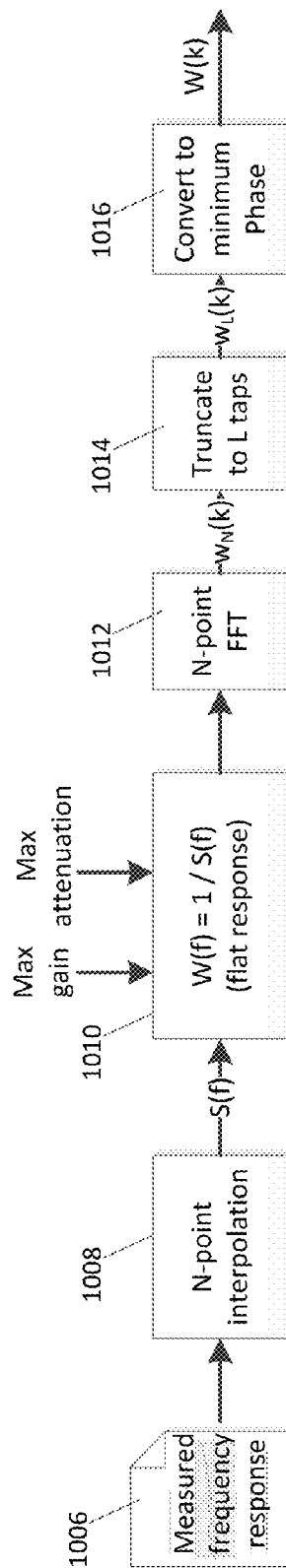
FIGS. 10C-10F are graphs illustrating the operation of the off-line FIR equalizer method described in FIGS. 10A-10B according to a non-limiting embodiment.

Turning to FIG. 10C, the various weights that can be applied by the FIR equalizer is then determined based on the measured frequency response, which may be measured off-line. For example, the measured frequency response of operation 1006 is interpolated using an n-point interpolation algorithm to generate a frequency response S(f) at operation 1008. At operation 1010, a flat response model W(f) is generated. According to a non-limiting embodiment, the flat response model is based on S(f), a max gain value, and a max attenuation value. An n-point Fast Fourier Transform (FFT) algorithm may then be applied to the flat response model W(f) so as to generate a weight setting as a function of the input audio signal ($w_n(k)$) at operation 1012. At operation 1014, the weight setting is truncated to a number of selected number tap lines, (i.e., taps) to generate a truncated weight setting ($w_L(k)$). The truncated weight setting $w_L(k)$ is then converted to minimum phase at operation 1016 so as to generate a final calculated weight ($W_k$).

Figure 10D:
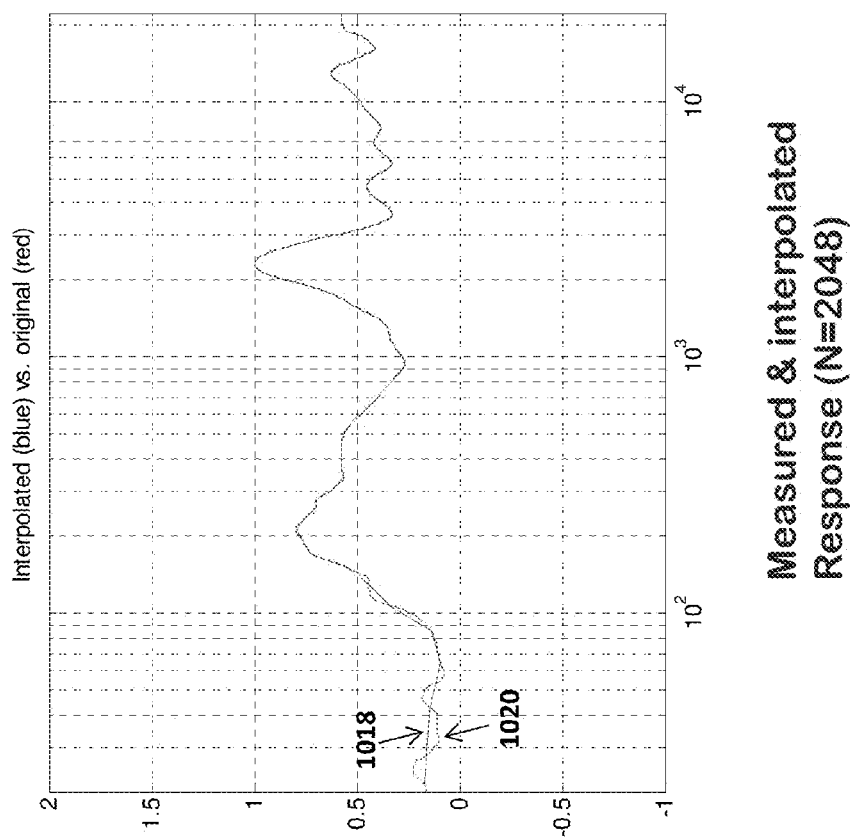
Figure 10E:
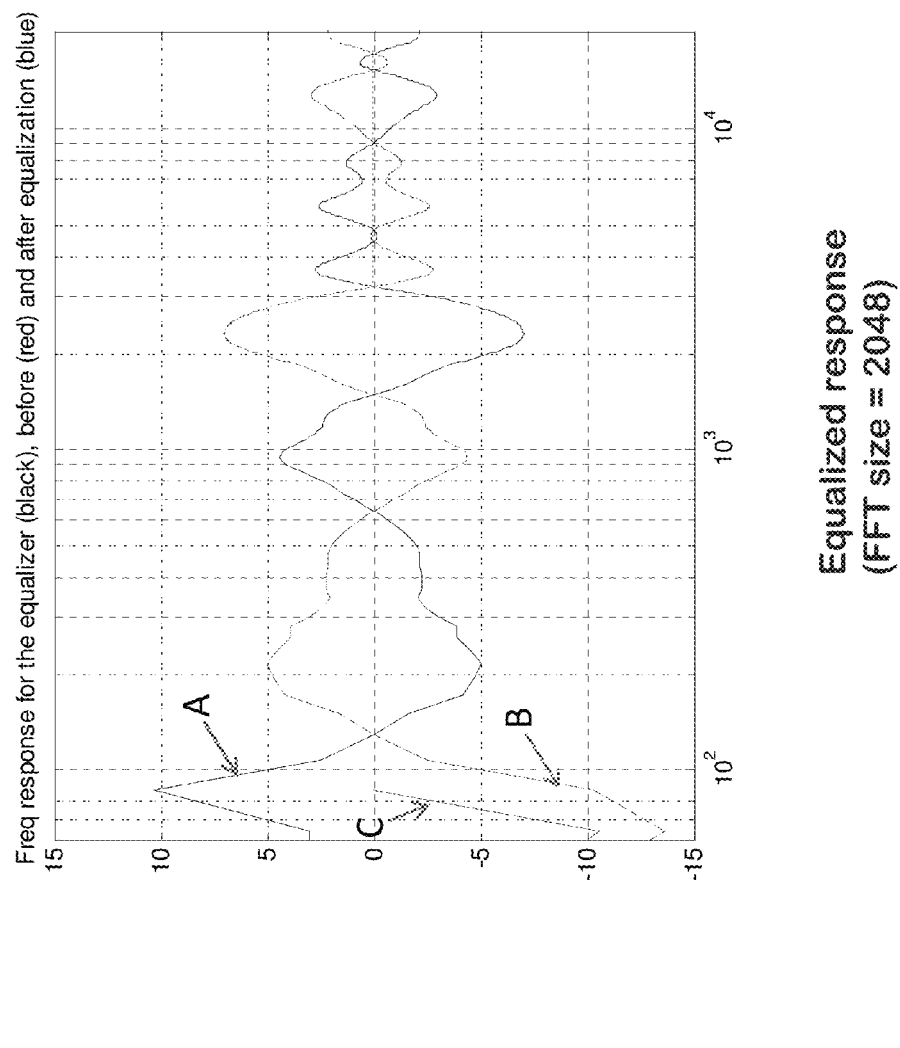
Figure 10F:
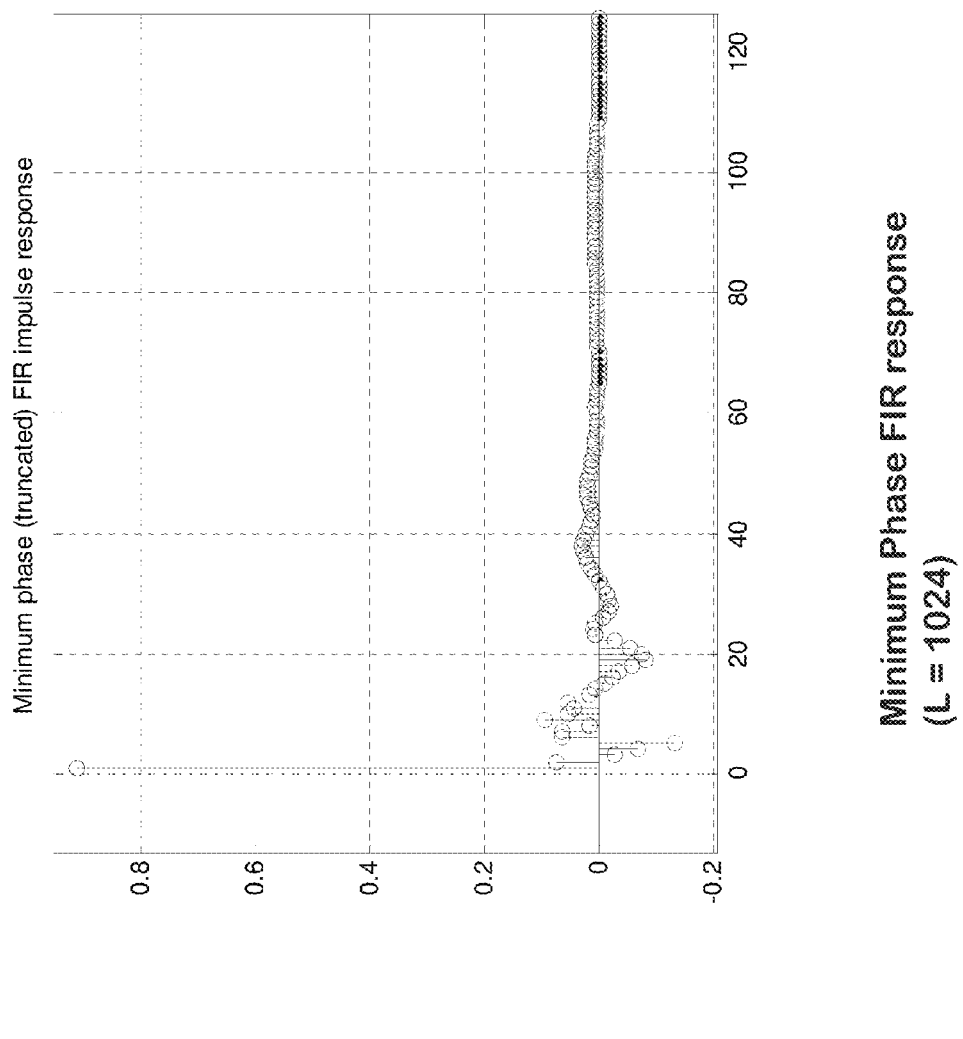

In at least one example, the measured response signal 1018 versus the interpolated response signal 1020 is illustrated in FIG. 10D. In another example, the equalized response when the FFT size is 2048 is illustrated in FIG. 10E. In this non-limiting example, the frequency response of the system (A) is illustrated with respect to the preliminary equalization signal (B) and the subsequent equalization signal (C). As illustrated in FIG. 10E, the FIR-based equalization signal (i.e., signal C) flattens the channel response with a small residual ripple caused by mismatch between the actual channel and the previous measured channel. When the underlying system (e.g., audio system 400) exists in minimum-phase, the group delay will be automatically equalized so as to produce "tighter" base sound characteristics in the output signal as further illustrated in FIG. 10F, for example.

Figure 11:
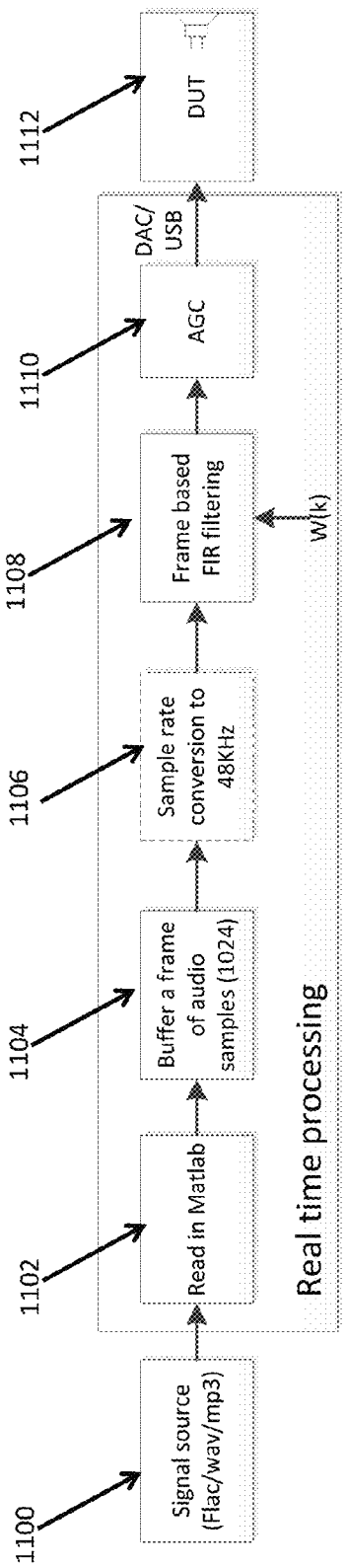
FIG. 11 illustrates a method of determining a real-time FIR equalizer design using an arithmetic modeling application to preprocess an input audio signal in real-time.

Referring to FIG. 11, a method of determining a real-time FIR equalizer design using an arithmetic modeling application (e.g., MATLAB) to preprocess the input audio signal (e.g., digital audio signal) in real-time is illustrated according to a non-limiting embodiment. At operation 1100, an audio signal is input into the arithmetic modeling application and is buffered according to an audio sampling rate. The signal source of the input signal may exist in various formats including, but is not limited to, a Free Lossless Audio Codec (FLAC) format, a Waveform Audio File Format (i.e., .wav format) and an Audio Layer III format (i.e., .mp3 format). At operation 1102, the input audio signal is preprocessed in real time. In at least one embodiment, the input audio signal is preprocessed using MATLAB software algorithms. In another embodiment, a digital signal processor (DSP) included in a FIR filter may be programmed to automatically preprocess the input audio signal in real time. At operation 1104, one or more frames of the audio signal are sampled. At operation 1106, the sample rate is converted to desired frequency, and a desired frequency response is defined using a FIR filtering unit at operation 1108. In at least one embodiment, the desired frequency response is generated using one or more weighted values. At operation 1110, the output of the FIR filtering unit is delivered to an electronic automatic gain control (AGC) unit which automatically adjusts the gain to ensure the equalized signal is maintained within the dynamic range of the speaker system before the adjusted output signal is converted from a digital signal to an analog signal. At operation 1112, the analog signal is then delivered to a DUT (e.g., a speaker) such that an analog audio signal can be delivered to a listener and/or listening device. According to an embodiment, the output analog audio signal can be converted into a digital signal, feedback to the arithmetic modeling application. Although not illustrated, the FIR filter may include a digital signal processor (DSP), which can be programmed to various acoustic models. In this manner, the DSP can perform the real-time FIR equalizer design.

Figure 12:
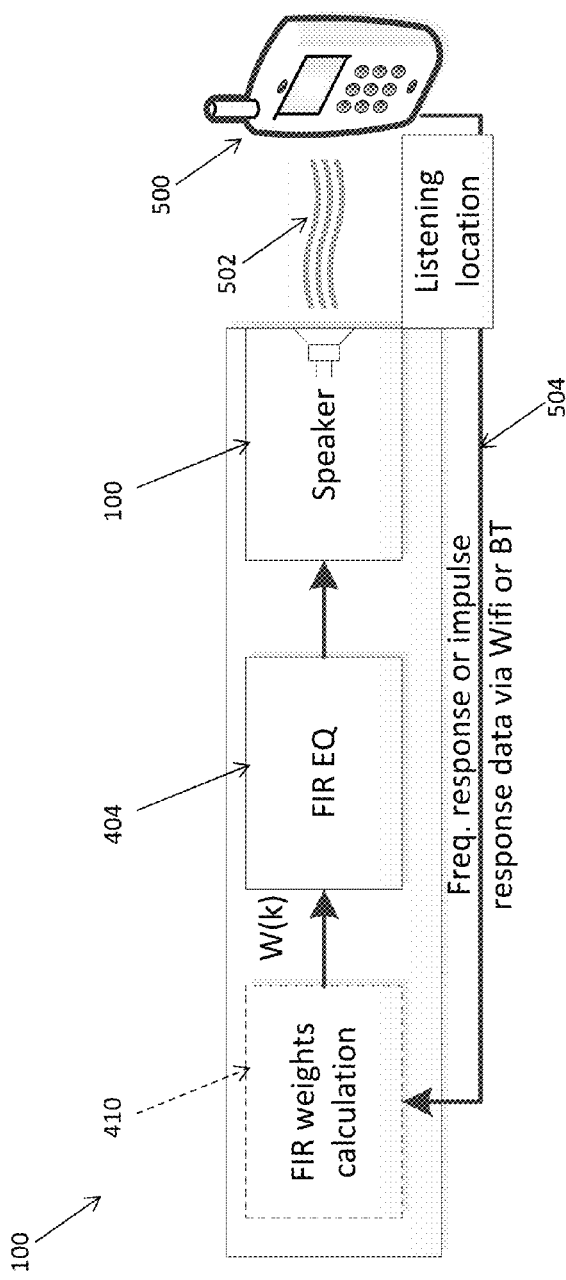
FIG. 12 illustrates a system of adaptively equalizing a speaker system based on feedback frequency response and/or impulse response data provided by a remotely located listening device.

According to another embodiment, a method of adaptively equalizing a speaker system 100 based on feedback frequency response and/or impulse response data provided by a remotely located listening device 500 is illustrated in FIG. 12. The listening device 500 receives an acoustic audio signal 502, and generates a feedback signal 504 indicating a frequency response and/or impulse response of the received output analog audio signal to the speaker system 100. In at least one embodiment, the feedback signal 504 may be exchanged via a wireless connection such as, for example, Wi-Fi or Bluetooth (BT), existing between the speaker system 100 and the listening device 500. Based on the feedback frequency response and/or impulse response data, a hardware control module 410 calculates FIR weighted values and a FIR equalizer unit 404 selects the equalizer coefficients to update the frequency response such that the speaker system 100 can adapt to the listening device 500 and/or environment at which the listening device 500 is located.

As described in detail above, various non-limiting embodiments provides a speaker system including an electronic multi-rate finite impulse response (FIR) filter or equalizer configured to correct non-linear distortion. The FIR equalizer may perform spectral inversion processing that initially provides an infinite number of taps which allow for sampling the input audio signal at a respective sampling interval. The taps may then be truncated to determine one or more weighted values or settings that can be applied to the input audio signal, thereby outputting an equalized audio sample that corrects the non-linear distortion or noise.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting-data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As used herein, the term "module" or "unit" refers to an application specific integrated circuit (ASIC), an electronic circuit, a microprocessor, a hardware computer processor (shared, dedicated, or group) and memory that executes one or more software or firmware programs, a combinational logic circuit, a microcontroller including various inputs and outputs, and/or other suitable components that provide the described functionality. The module is configured to execute various algorithms, transforms, and/or logical processes to generate one or more signals of controlling a component or system. When implemented in software, a module can be embodied in memory as a non-transitory machine-readable storage medium readable by a processing circuit (e.g., a microprocessor) and storing instructions for execution by the processing circuit for performing a method.

What is claimed is:
1. A speaker system comprising:
an electronic signal processing unit including a band splitting filter configured to split an input audio signal into a low-pass audio component and a high-pass audio component, the electrical signal processing unit further including a multi-rate finite impulse response (FIR) filter configured to downsample the low-pass audio component and sample the downsampled low-pass audio component at a first sampling rate lower than a second sampling rate used to sample the high-pass audio component;
an electronic adaptive equalizer coefficient (EAEC) module configured to determine a current power level of the input signal as a power level of the input signal changes and to dynamically determine at least one equalizer coefficient based on a comparison between the current power level and look-up table that cross-references a plurality of equalizer coefficients to a predetermined power level value; and an electronic filter coefficient update unit (FCUU) in signal communication with an input of the band splitting filter, the FCUU configured to control a frequency response of the speaker system based on the at least one equalizer coefficient corresponding to the current power level of the input signal.

2. The speaker system of claim 1, further comprising an all-pass IIR filter configured to compensate for at least one of phase error and group delay while the speaker system exists in a non-minimum phase, wherein the multi-rate FIR filter corrects the amplitude of the low-pass audio component and the high-pass audio component.

3. The speaker system of claim 1, wherein the multi-rate FIR filter operates according to at least one weighted setting that is calculated based on at least one of the low-pass audio component and the high-pass audio component.

4. The speaker system of claim 3, wherein the multi-rate FIR filter includes a plurality of taps configured to output a sampling interval $(u_i\text{-}u_L)$ of the input signal.

5. The speaker system of claim 4, wherein the multi-rate FIR filter operates according to the at least one weighted setting that is further calculated based on the sampling interval of a respective tap.

6. The speaker system of claim 5, wherein the at least one weighted value is converted to a minimum phase.

7. A method of equalizing an acoustic audio signal processed by a speaker system, the method comprising:

splitting an input audio signal into a low-pass audio component and a high-pass audio component using a band splitting filter;

downsampling the low-pass audio component using a multi-rate finite impulse response (FIR) filter;

sampling the downsampled low-pass audio component at a first sampling rate lower than a second sampling rate used to sample the high-pass audio component;

determining, via an electronic adaptive equalizer coefficient (EAEC) module, a current power level of the input signal as a power level of the input signal changes;

dynamically determining, via the EAEC, at least one equalizer coefficient based on a comparison between the current power level and look-up table that cross-references a plurality of equalizer coefficients to a predetermined power level value;

delivering the at least one equalizer coefficient corresponding to the current power level of the input signal to an electronic filter coefficient update unit (FCUU); and outputting a frequency response signal to an input of the band splitting filter to control a frequency response of the speaker system based on the at least one equalizer coefficient corresponding to the current power level of the input signal.

8. The method of claim 7, further comprising:
determining the speaker system is in a non-minimum phase;
compensating for at least one of phase error and group delay when the speaker system exists in a non-minimum phase; and
correcting the amplitude of the low-pass audio component and the high-pass audio component.

9. The method of claim 7, further comprising generating at least one weighted setting based on at least one of the low-pass audio component and the high-pass audio component.

10. The method of claim 9, outputting a sampling interval $(u_i\text{-}u_L)$ of the input signal, each sampling interval output on a respective tap line in signal communication with the input audio signal.

11. The method of claim 10, further comprising calculating the at least one weighted setting based on the sampling interval of a respective tap.

12. The method of claim 11, further comprising converting the calculating at least one weighted setting to a minimum phase.

13. An adaptive audio equalization system, comprising:
at least one audio speaker configured to generate an acoustic audio signal; and
an electronic signal processing unit configured to receive a feedback signal output from a listening device disposed in an environment remotely located from the audio speaker, and to dynamically equalize the acoustic audio signal delivered to the listening device based on acoustic conditions of the environment, the electronic signal processing unit comprising:
a band splitting filter configured to split the feedback signal into a low-pass audio component and a high-pass audio component, the electrical signal processing unit further including a multi-rate finite impulse response (FIR) filter configured to downsample the low-pass audio component and sample the downsampled low-pass audio component at a first sampling rate lower than a second sampling rate used to sample the high-pass audio component;
an electronic adaptive equalizer coefficient (EAEC) module configured to determine a current power level of the feedback signal as a power level of the feedback signal changes and to dynamically determine at least one equalizer coefficient based on a comparison between the current power level and look-up table that cross-references a plurality of equalizer coefficients to a predetermined power level value; and
an electronic filter coefficient update unit (FCUU) in signal communication with an input of the band splitting filter, the FCUU configured to control a frequency response of the speaker system based on the at least one equalizer coefficient corresponding to the current power level of the feedback signal.

14. The adaptive audio equalization system of claim 13, wherein the feedback signal indicates at least one of a frequency response and an impulse detected by the listening device.

15. The adaptive audio equalization system of claim 14, wherein the electronic signal processing unit further comprises:
an electronic weight setting unit configured to calculate at least one weighted value based on the frequency response; and
wherein the multi-rate finite impulse response (FIR) equalizer unit configured to determine an equalizer response value W(f) based on the at least one weighted value, and to equalize the acoustic audio signal output from the at least one speaker so as to compensate for real-time sound existing locally in the environment.

16. The adaptive audio equalization system of claim 15, wherein the feedback signal is communicated to the electronic signal processing unit via at least one of Wi-Fi and Bluetooth.

* * * * *